United States Patent [19]

Burton

[11] Patent Number: 4,468,705

[45] Date of Patent: Aug. 28, 1984

[54] DATA TRANSITION ENHANCEMENT

[75] Inventor: Jack D. Burton, Orlando, Fla.

[73] Assignee: Exxon Research and Engineering Co., Florham Park, N.J.

[21] Appl. No.: 328,143

[22] Filed: Dec. 7, 1981

[51] Int. Cl.³ .................. H04N 1/40; H04N 5/14
[52] U.S. Cl. .................. 358/284; 328/114; 358/166
[58] Field of Search ......... 358/166, 280, 282, 284, 358/263; 328/114, 132; 307/517

[56] References Cited

U.S. PATENT DOCUMENTS

| 3,223,778 | 12/1965 | Stone et al. | 178/7.1 |
| 3,413,412 | 11/1968 | Townsend | 178/7.1 |
| 3,471,638 | 10/1969 | De Groat | 178/6 |
| 3,472,958 | 10/1969 | Estock | 178/7.2 |
| 3,723,649 | 3/1973 | Pitegoff et al. | 178/7.1 |
| 3,868,477 | 2/1975 | Katzman | 178/6 |
| 3,947,699 | 3/1976 | Whitmer | 328/114 |
| 4,199,728 | 4/1980 | Carpenter | 328/114 |
| 4,315,285 | 2/1982 | Sommer et al. | 358/284 |

FOREIGN PATENT DOCUMENTS 1107913 3/1968 United Kingdom .
1325187 8/1973 United Kingdom .
1390261 4/1975 United Kingdom .
1603554 11/1981 United Kingdom .

Primary Examiner—Joseph A. Orsino, Jr.
Attorney, Agent, or Firm—Norman L. Norris; Dale Heist

[57] ABSTRACT

A data enhancement circuit for a facsimile receiver is provided. The circuit includes positive and negative slope detectors as well as a signal threshold detector. Incoming signals above the signal threshold and having a positive slope are considered black. Incoming signals above the signal threshold but with a negative slope are considered white. Incoming signals below the threshold are always considered white. Incoming signals above the signal threshold and with a negative slope having a slope magnitude less than a predetermined slope magnitude are considered gray. The circuit of the present invention reacts to high speed data and provides enhancement for images in a gray scale.

10 Claims, 5 Drawing Figures

DATA TRANSITION ENHANCEMENT

BACKGROUND OF THE INVENTION

This invention relates to a method and apparatus for assuring the accurate reproduction of data transmitted or received in a variety of applications including, but not limited to, use in a facsimile transmission system.

In facsimile applications, it is important to accurately sense, transmit, receive and reproduce black/white information on a document located at one location and reproduce that information at another location so as to generate an accurate and faithful facsimile. However, a substantial amount of detail which was present at the transmitting location may be lost such that the reproduction at the receiving location is less than faithful. Difficulties in achieving a faithful reproduction or facsimile are greatly compounded by the limited bandwidth available for a typical facsimile transmission over the telephone network where the information rate is high.

Video enhancement techniques have been employed in facsimile apparatus. Such a technique is disclosed in U.S. Pat. No. 3,868,477—Katzman wherein a black and white threshold detector is disclosed in combination with positive and negative peak detectors to achieve black/white transitions even when the signal lies on one side of the threshold. Black and white threshold detectors have also been utilized to enhance data as disclosed in U.S. Pat. No. 3,723,649—Pitegoff et al and U.S. Pat. No. 3,413,412—Townsend.

In the above-described Katzman patent, the peak detectors include a capacitor which stores a past black or white peak value. The current value of the video signal is then compared against the stored past peak value. When the current value differs from the stored past black or white peak value by a predetermined amount, a black/white transition in the circuit output occurs. One difficulty with the Katzman circuit is that if the time constant and the rate of charging of the storage capacitor is too slow, the detector will not be able to respond to rapid black/white changes. It would be desirable to faithfully transmit rapidly changing, i.e., high speed black/white data even over lines which are bandwidth limited.

Moreover, the data enhancement technique disclosed in the Katzman patent while reproducing black and white does not provide for the enhancement of a gray scale. In other words, a change in signal level on one side of the threshold is reproduced as black or white but there is no reproduction of various shades of gray or means by which a gray effect can be achieved.

SUMMARY OF THE INVENTION

It is an object of this invention to provide an improved video enhancement technique which is effective even with high information rates.

It is a further object of this invention to provide such a video enhancement technique which allows for the setting of very low threshold levels.

It is a still further object of this invention to provide a video enhancement technique which better defines leading and trailing edges of data.

It is a still further object of this invention to provide a data enhancement technique which is capable of enhancing data with a gray scale effect.

In accordance with these and other objects of the present invention, the slope of incoming signals is detected. When a first slope is detected a signal representing data in one state is generated and when a second slope is detected a signal representing data in another state is generated.

In the preferred embodiment of the invention, threshold detection is also provided. When the data lies on one side of the signal threshold, slope detection is enabled such that the signal produces data in one state in response to a positive slope and data in the other state in response to a negative slope. When the data lies on the other side of the threshold, slope detection is ignored such that the resulting signals only represent data in the other state.

In accordance with another important aspect of the invention, the magnitude of slope is also determined in addition to a determination of whether the slope is positive or negative. Thus, when a negative slope having a magnitude less than a predetermined slope magnitude is detected simultaneously with the signal threshold being exceeded a gray scale is achieved.

DETAILED DESCRIPTION OF A PREFERRED EMBODIMENT

Figure 1:
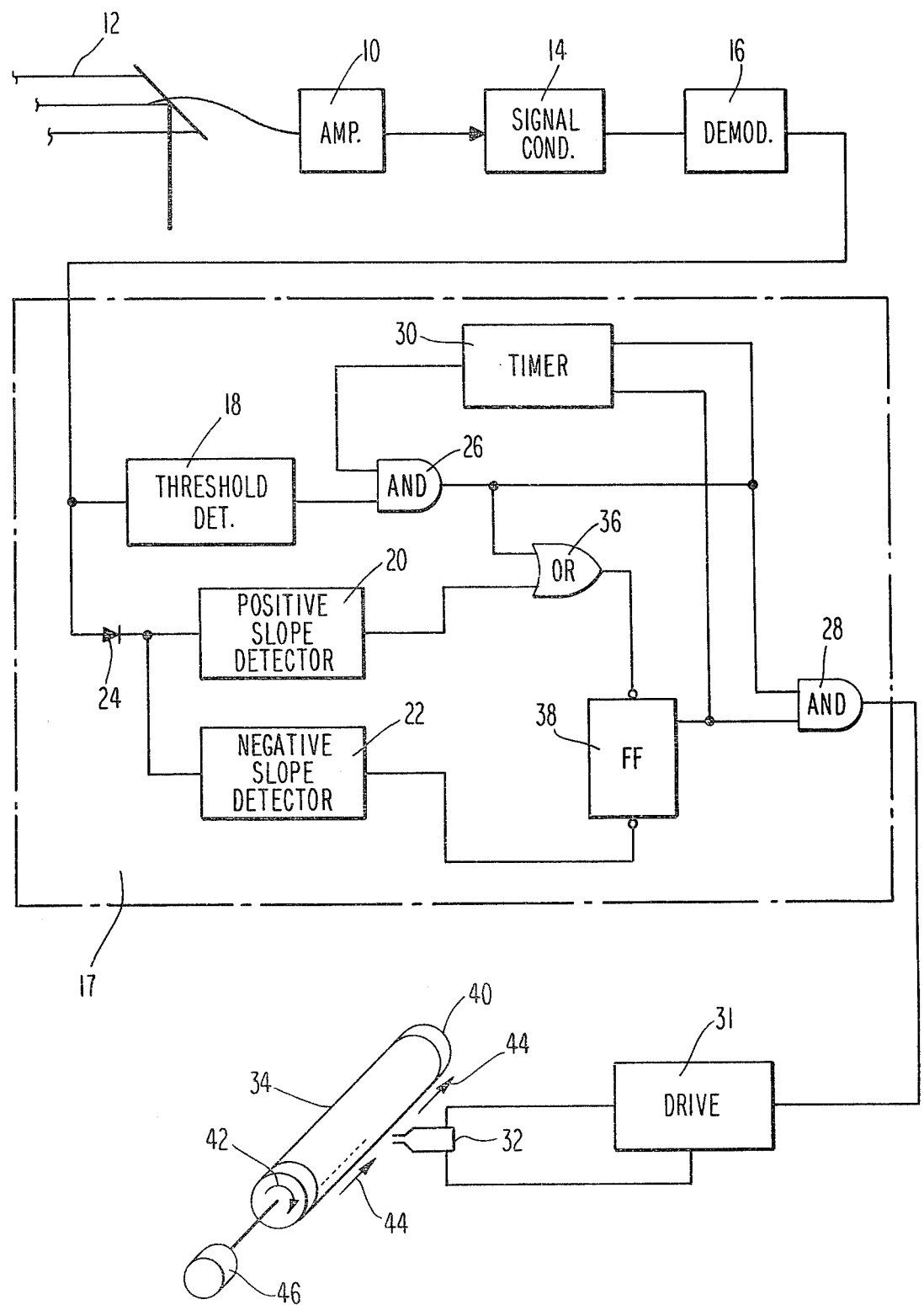
FIG. 1 is a schematic diagram of the facsimile receiver employing a data enhancement technique in accordance with this invention.

Referring to FIG. 1, the facsimile receiver of a facsimile system is disclosed. The receiver comprises an amplifier 10 which is coupled to a data transmission link such as a telephone line 12. The facsimile signals which are amplified by the amplifier 10 as received from the telephone line 12 are then subjected to signal conditioning (e.g., filtering) and a signal conditioning network 14 is coupled to the input of a demodulator 16 for this purpose. The output from the demodulator 16 is coupled to a data enhancement circuit 17 which embodies the principles of this invention which will now be described.

The data enhancement circuit 17 includes a threshold detector 18 which establishes a predetermined signal threshold. As will subsequently be described, demodulated signals representing black/white information from a remotely-located document and which lie on one side of the threshold will produce one output from the threshold detector 18 while signals of the other side of that threshold will produce another output from the threshold detector 18. For purposes of simplicity, the threshold established by the threshold detector 18 may be thought of as a threshold between black and white data.

In addition to the threshold detector 18, the data enhancement circuit 17 of FIG. 1 also includes a positive slope detector 20 and a negative slope detector 22. The positive slope detector 20 and the negative slope detector 22 (which are coupled to the output of the demodulator circuit 16 through a diode 24 which will only conduct near ground) actually measure the slope or slew rate of the analog signal demodulated by the demodulator 16. The positive slope detector 20 is operative on one side of the threshold established by the threshold detector 18 to produce a data output signal of one state when the slope is positive and the signal is above the threshold established by the detector 18. The negative slope detector 22 is operative on the same side of the threshold established by the threshold detector 18 to produce a data output signal of the opposite state when the slope is negative. This function is accomplished through the use of logic circuitry operating in conjunction with the threshold detector 18 and positive and negative slope detectors 20 and 22 as will now be described.

As shown in FIG. 1, the threshold detector 18 has an output coupled to an AND gate 26 which is in turn coupled to an AND gate 28. The AND gate 26 is, under normal circumstances, enabled by the output of a timer circuit 30 which will subsequently be described. Accordingly, the output of the AND gate 28 is controlled by the output of the threshold detector 18, i.e., if the input signal to the threshold detector 18 is below the threshold level, the output from the AND gate 28 will be low. Accordingly, no output signal will be applied to a drive circuit 31 which is coupled to an ink jet 32 for applying droplets of ink to a copy medium 34. On the other hand, if the input signal to the threshold detector 18 is above the predetermined threshold level, the AND gate 28 will be enabled only if the other input to the AND gate 28 is high and this is determined by the slope detectors 20 and 22 and logic circuitry associated therewith.

Associated with the slope detectors 20 and 22 is a means for generating a signal having one state when a first predetermined slope is detected and a second state when a second predetermined slope is detected. This means includes an OR gate 36 which is coupled to the output of the positive slope detector 20 as well as to the output of the AND gate 26 and further includes a flip-flop 38. The output from the OR gate 36 is applied to the set input of the flip-flop 38 which controls the other input of the AND gate 28. The reset terminal of the flip-flop 38 is coupled to the output of the negative slope detector 22. It will, therefore, be understood that the flip-flop 38 will be set so as to enable the AND gate 28 in response to an output from the threshold detector 18 unless the flip-flop 38 is reset by the output of the negative slope detector 22. This, of course, inhibits the AND gate 28 and prevents the drive circuit 31 from energizing the ink jet 32. As a result, there is no droplet of ink projected from ink jet 32 to the copy medium 34.

It will be appreciated from the apparatus shown in FIG. 1 that the copy medium 34 is mounted on a drum 40 which rotates about an axis as depicted by an arrow 42 while the ink jet 32 is moved in a direction parallel with the axis of the drum as depicted by arrows 44. The drum 40 is rotated in the direction 42 by a motor 46.

Figure 2:
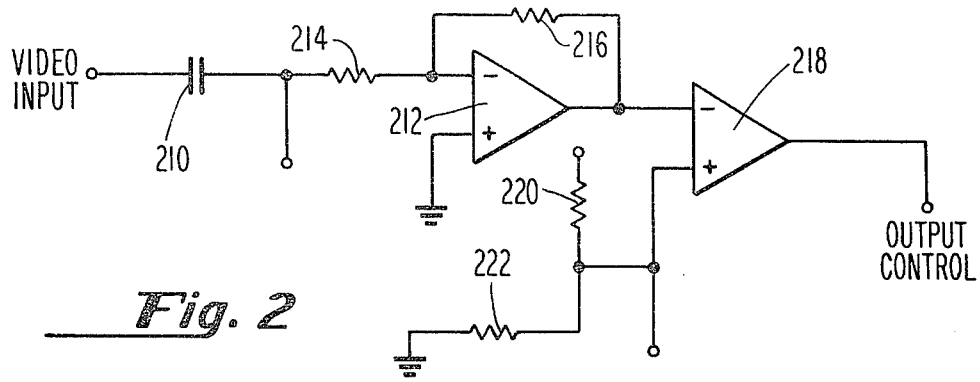
FIG. 2 is a schematic diagram of a slope detector circuit useful in the facsimile receiver of FIG. 1.

Referring now to FIG. 2, one exemplary embodiment of the positive slope detector 20 will be described in detail. The positive slope detector 20 of FIG. 2, preferably comprises a capacitor 210 which differentiates the input signal applied thereto from the demodulator circuit 16 by way of the diode 24. The differentiated signal from the capacitor 210 is directed to an amplifier 212. The amplifier 212 includes an input resistor 214 connected between the capacitor 210 and the inverting input and also includes a feedback resistor 216 as shown. The non-inverting input of amplifier 212 is connected to ground. The output of the amplifier 212 is directed to the inverting input of a comparator 218. The non-inverting input of the comparator 218 is a voltage determined by a voltage divider network including resistors 220 and 222.

The voltage across capacitor 210 is proportional to the slope of an incoming signal. This voltage is amplified by the amplifier 212 and compared against a threshold determined by the voltage divider network 220, 222. If the amplified voltage at the inverting input of the comparator 218 exceeds the threshold voltage at the non-inverting input of the comparator, the circuit of FIG. 2 determines that a positive slope exits and flip-flop 38 shown in FIG. 1 is set.

Figure 3:
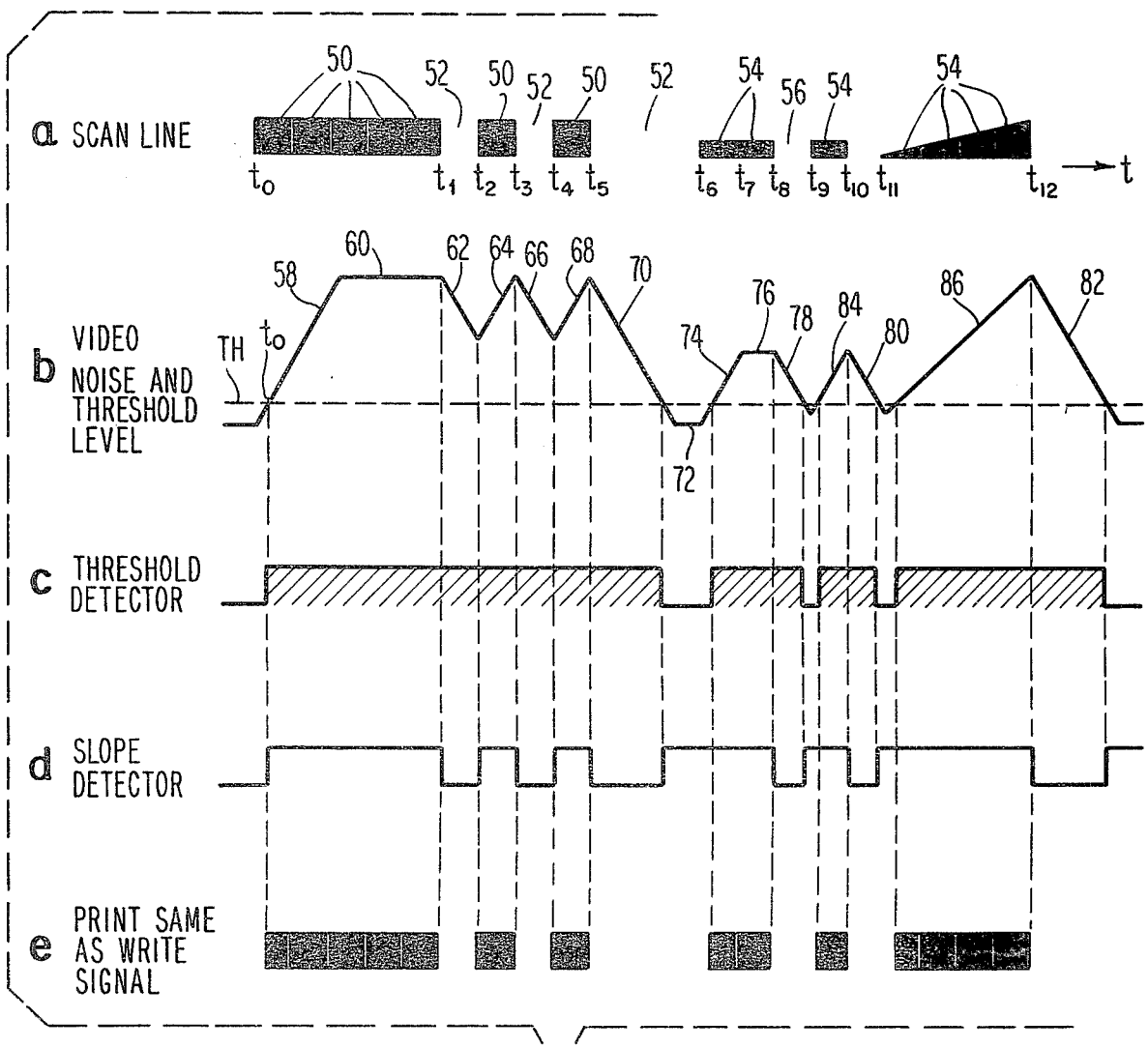
FIG. 3 is a waveform diagram utilized in explaining the operation of the data enhancement technique utilized in the embodiment of FIG. 1.

In order to appreciate the data enhancement achieved by the circuitry shown in FIG. 1, reference will now be made to FIG. 3. As shown in waveform a of FIG. 3, black, white and gray data is represented. Areas 50 represent black data which will be found on the remotely located document which the signals on the telephone line 12 are intended to represent. The white areas 52 between the various black areas are also present. In addition, gray areas 54 exist which are separated by white areas 56. The gray area at the right hand most extremity of waveform a is of ever-increasing darkness with time t.

The data waveform "a" produces video signal as shown in waveform "b" which tracks the black, white and gray levels as shown in waveform "b". It will be seen that the signal of waveform "b" includes a ramp 58 where the onset of the black area time $t_0$ corresponds with the crossing of a threshold TH at $t_0$. Between time $t_0$ and $t_1$, the signal reaches a constant amplitude 60 and continues at that amplitude until $t_1$. At time $t_1$, the video signal decreases with a negative slope 62 until time $t_2$ where the slope 62 corresponds with the white area 52. This is followed by a positive slope 64 from time $t_2$ to $t_3$, a negative slope 66 from time $t_3$ to $t_4$ and a positive slope 68 between times $t_4$ and $t_5$ which correspond with black, white and black areas respectively.

At time $t_5$, the signal proceeds with a negative slope 70 which corresponds with an elongated white area 52 between times $t_5$ and $t_6$. The white area 52 is of a sufficient duration so as to permit the negative slope 70 to cross the threshold TH and actually reach a low constant amplitude 72 below the threshold TH. However, at time $t_6$ which is followed by a period of gray 54, the signal begins a positive slope 74 and crosses the threshold TH sometime between $t_6$ and $t_7$ and proceeds to a constant amplitude 76 which is substantially less than the peak amplitude 60 achieved during the extended period of black 50. The peak 76 is followed by negative slopes 78, 80 and 82 with intermediate positive slopes 84 and 86. The positive slope 86 is somewhat more gradual due to the increasing darkness of the gray area 50 between times $t_{11}$ and $t_{12}$.

The waveform "b" which corresponds with the data of waveform "a" is generally representative of the output of the demodulator 16. It is this signal represented by the waveform "b" which is operated upon by the threshold detector 18 and the positive and negative slope detectors 20 and 22. This will be appreciated with reference to waveform "c" and "d".

The waveform "c", which represents the output from the threshold detector 18, is a binary signal which is in the high state whenever the threshold TH is crossed by the signals shown in waveform "b". It is this waveform "c" which is ANDed with the output from the flip-flop 38 at AND gate 28. The output from the flip-flop 38 is shown at waveform "d" where the high state generally corresponds with the areas of positive slope and constant amplitude in waveform "b" and the low state corresponds with areas of negative slope. By virtue of ANDing the waveform "c" and "d", a black/white output is achieved which provides a data output in the black state when the signal is on one side of a predetermined threshold TH (e.g. above that threshold) unless the slope of the signal is negative in which case data in the opposite or white state is generated.

From the foregoing it will be appreciated that the black/white data of waveform "e" is generated at the output the AND gate 28 even though the slewing rate of the signal shown in waveform "b" is so fast as to prevent the signal from crossing the threshold TH. By detecting the direction of the slope of the signal shown in the waveform "b", i.e., whether positive or negative data as shown in waveform "e" may be generated which more closely follows the actual data in the scan line as shown in waveform "a". Note however, that the gray levels are not replicated but rather converted to black. However, in some instances, a certain gray level effect may be achieved as a result of the timer circuit 30. The timer circuit 30 is utilized to ascertain whether the magnitude of a negative slope is greater than a predetermined slope magnitude as will now be described with reference to FIGS. 4 and 5.

Figure 4:
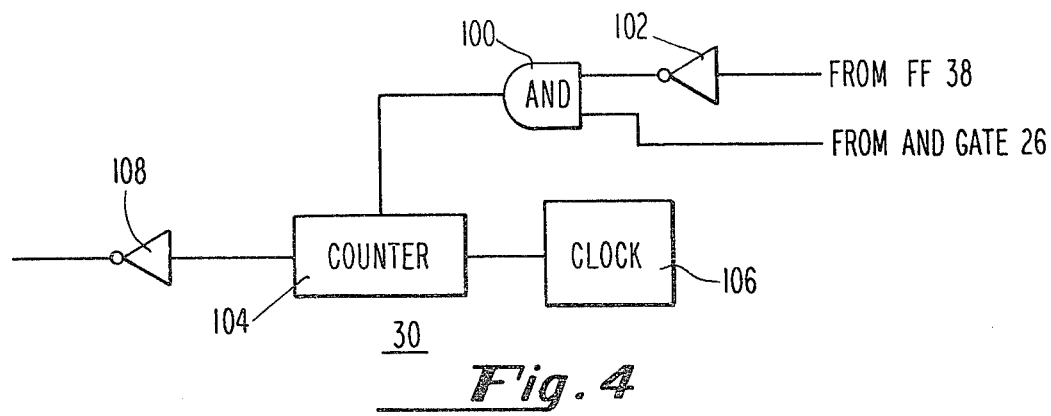
FIG. 4 is a schematic diagram of a block shown in the schematic diagram of FIG. 1 which provides another important aspect of the data enhancement technique.
Figure 5:
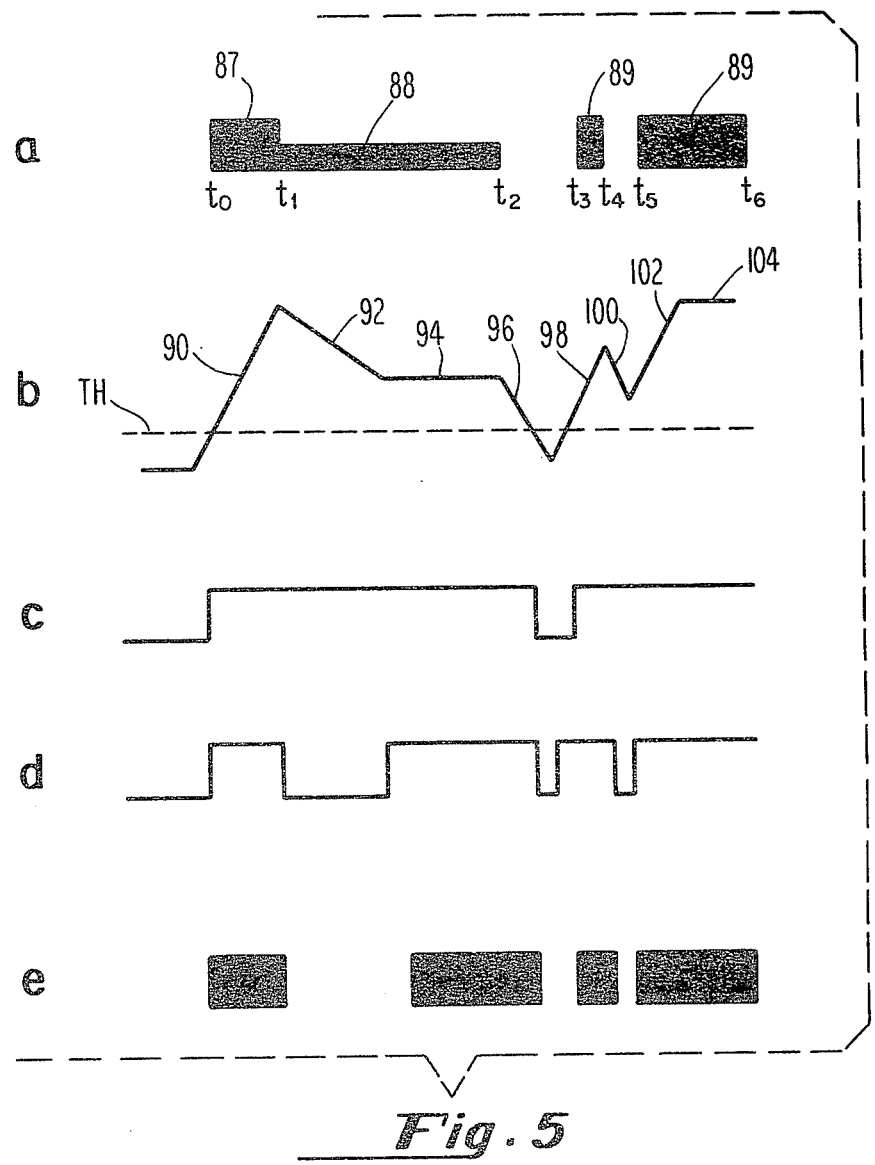
FIG. 5 is a waveform diagram utilized in explaining the operation of the circuit shown in FIG. 3.

As first shown in waveform "a" of FIG. 5, a black level 87 is generated from time $t_0$ to $t_1$ and this is immediately followed by a gray level 88 which continues until time $t_2$. From $t_2$ to $t_3$, white is present, followed by a burst of black 89 from $t_3$ to $t_4$, white again from $t_4$ to $t_5$ and then black 89 from $t_5$ to $t_6$. The actual signal as shown in waveform "b" which is generated as a result of the scanned data shown in waveform "a" includes a positive slope 90 between times $t_0$ and $t_1$ where $t_0$ represents the crossing of the threshold TH and a negative slope 92 beginning at a time $t_1$ with the onset of gray down to a constant gray level amplitude 94. This is followed with a negaive slope 96 at time $t_2$, a positive slope 98 until time $t_4$, a negative slope 100 until time $t_5$ and a positive slope 102 followed by a constant amplitude level 104 up through time $t_6$. Waveform "c" reresents the output of the threshold detector 18 which is in the high state for most of the time from $t_0$ to $t_6$ except for a brief period between times $t_2$ and $t_3$. Waveform "d" represents the output of the flip-flop 38 which represents the detection of positive and negative slopes. Note, however, that the output represented by waveform "d" goes to the high state between times $t_1$ and $t_2$ even though no positive slope has been detected after the negative slope 92. Although no positive slope is detected between times $t_1$ and $t_2$, it will be appreciated that the gray area between times $t_1$ and $t_2$ is not properly represented by a white output. Rather, it is necessary to achieve a gray if not black output between time $t_1$ and $t_2$ if the semblance of gray is to be achieved between times $t_1$ and $t_2$. This is accomplished with a circuit shown in FIG. 4 which comprises the timer circuit 30 of FIG. 1.

Referring now to FIG. 4, the output from the flip-flop 38 is applied to an AND gate 100 through an inverter 102 while the output from an AND gate 26 is applied to the other input of the AND gate 100. The output of the AND gate 100 is utilized to enable a counter 104 supplied by a clock 106. When a predetermined count within the counter representing a predetermined duration is reached, the output of the counter 104 which is applied to an inverter 108 goes high which in turn drives the output of the inverter 108 low so as to inhibit the AND gate 26 which in turn forces the flip-flop 38 to go high as if positive slope had been detected.

It will be understood that the counter 104 is programed or preset such that an output is achieved in a predetermined length of time after the count is initiated which corresponds to the length of time necessary for the slew of the system to go from black through the threshold TH. If the threshold TH is not reached in a predetermined length of time determined by the counter 104, it is known that a negative slope has a magnitude less than the predetermined slope magnitude of a black level. Thus, it is assumed that a gray level has intervened to prevent the threshold TH from being reached and the system is forced into showing black as an output by setting the flip-flop 38. Thus, in waveform "e" of FIG. 5, a black level is shown between times $t_1$ and $t_2$ which, in fact, corresponds to the gray level between $t_1$ and $t_2$ or at least simulates to some degree that gray level.

It will, therefore, be appreciated that the technique for enhancing data is effective in enhancing black and white data as well as black and white data including gray levels. Where gray levels are utilized, the enhancement takes the form of a separation in black levels so as to achieve a gray effect.

Although the invention has been described in terms of a facsimile receiver in conjunction with an ink jet marking system, it will be appreciated that data enhancement can also be utilized in a facsimile transmitter between the sensing of the data on the document itself and the modulator which generates the signals for transmission over a communications link. Moreover, the technique for data enhancement may be utilized in other areas unrelated to facsimile.

Although a particular invention has been shown and described, it will be appreciated that other embodiments will occur to those of ordinary skill in the art. Such embodiments and/or modifications fall within the true spirit and scope of the invention as set forth in the appended claims.

I claim:

1. In a facsimile system for producing a copy at one location representing a facsimile of a document at another location, a data enhancement system responsive to an analog signal representing dark/light information on a document, said data enhancement system comprising:

slope detector means for differentiating said analog signal;

threshold detecting means for detecting when the analog signal is on one side of a signal threshold;

means for generating an output signal having one state in response to the detection of a first predetermined slope and another state in response to the detection of a second predetermined slope, said means for generating an output signal further including means for generating said one state only when said analog signal is on said one side of said threshold; and timing means for timing the duration of said second predetermined slope, said means for generating an output signal generating said another state after said slope detector means detects said second predetermined slope and the time duration of said second predetermined slope exceeds a predetermined duration and said first signal exceeds said signal threshold.

2. The facsimile system of claim 1 wherein said first predetermined slope is positive and said second predetermined slope is negative.

3. The facsimile system of claim 1 wherein said first predetermined slope is a positive slope and said second predetermined slope is a negative slope having a magnitude greater than a predetermined slope magnitude.

4. A data enhancement apparatus for converting an analog signal to a binary signal comprising:
slope detector means for differentiating said analog signal; and
means for generating an output signal having one state in response to the detection of a first predetermined slope in one direction and another state in response to the detection of a second predetermined slope in another direction and below a predetermined slope magnitude.

5. The data enhancement apparatus of claim 4 further comprising:
threshold detecting means for detecting when the analog signal is on one side of a threshold; and
said means for generating an output signal including means for generating said one state only when said analog signal crosses said threshold.

6. The data enhancement apparatus of claim 5 wherein said first predetermined slope is in one direction and said second predetermined slope is in another direction, and further comprising:
timing means for timing the duration of the slope in said other direction; and
means for generating an output signal representing data in said one state after said slope detector means detects the slope in the other direction and the time duration of slope in the other direction exceeds a predetermined duration and said analog signal exceeds said threshold.

7. The data enhancement apparatus of claim 4 wherein said slope detector means include:
a positive slope detector;
a negative slope detector; and
said means for generating a signal comprises logic means coupled to said positive slope detector and to said negative slope detector, said logic means producing an output in one state in response to said first predetermined slope by the positive slope detector and the other state in response to said second predetermined slope detected by the negative slope detector.

8. The data enhancement apparatus of claim 7 further comprising:
threshold detecting means for detecting when the analog signal is on one side of said threshold; and
said means for generating an output signal comprises AND means coupled to said logic means and said threshold detecting means so as to permit the generation of a signal in said one state only when said AND means is enabled by said threshold detecting means.

9. In a fasimile system for producing a copy at one location representing a facsimile of a document at another location, a data enhancement system responsive to an analog signal representing dark/light information on a document, said data enhancement system comprising:
slope detector means for differentiating said analog signal, said slope detector means including:
a positive slope detector; and
a negative slope detector; and
means for generating an output signal having one state in response to the detection of a first predetermined slope and another state in response to the detection of a second predetermined slope, said means comprising logic means coupled to said positive slope detector and to said negative slope detector, said logic means producing an output in one state in response to said first predetermined slope detected by the positive slope detector and the other state in response to said second predetermined slope detected by the negative slope detector, said first predetermined slope being either a positive slope or a negative slope having a magnitude less than a predetermined slope magnitude and said second predetermined slope being a negative slope having a magnitude greater than said predetermined magnitude.

10. The facsimile system of claim 9 further comprising:
threshold detecting means for detecting when the analog signal is on one side of a signal threshold; and
said means for generating an output signal comprises AND means coupled to said logic means and to said threshold detecting means so as to permit the generation of an output signal in said one state only when said AND means is enabled by said threshold detecting means.

* * * * *